(12) United States Patent
Chung et al.

(10) Patent No.: US 7,829,245 B2
(45) Date of Patent: Nov. 9, 2010

(54) MASK FOR SEQUENTIAL LATERAL SOLIDIFICATION AND METHOD OF MANUFACTURING THE SAME

(75) Inventors: Se-jin Chung, Yongin-si (KR); Dong-bum Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 693 days.

(21) Appl. No.: 11/499,477

(22) Filed: Aug. 4, 2006

(65) Prior Publication Data

US 2007/0032050 A1 Feb. 8, 2007

(30) Foreign Application Priority Data

Aug. 4, 2005 (KR) .................... 10-2005-0071414

(51) Int. Cl.
G03F 1/00 (2006.01)
(52) U.S. Cl. .......................................... 430/5
(58) Field of Classification Search .................. 430/5, 430/22, 30; 382/144
See application file for complete search history.

(56) References Cited

U.S. PATENT DOCUMENTS

| | | | | |
|---|---|---|---|---|
| 5,970,368 | A * | 10/1999 | Sasaki et al. | 438/487 |
| 6,322,625 | B2 * | 11/2001 | Im | 117/43 |
| 7,371,484 | B2 * | 5/2008 | Lee et al. | 430/5 |
| 2004/0087116 | A1 * | 5/2004 | Nakayama | 438/487 |
| 2006/0024592 | A1 * | 2/2006 | Kim | 430/5 |
| 2006/0121369 | A1 * | 6/2006 | Hwang | 430/5 |

FOREIGN PATENT DOCUMENTS

| | | |
|---|---|---|
| JP | 2004-311935 | 11/2004 |
| KR | 10-0484399 | 4/2005 |
| KR | 10-0486676 | 4/2005 |

OTHER PUBLICATIONS

Patent Abstracts of Japan, Publication No. 2004-311935, Nov. 4, 2004, 1 p.
Korean Patent Abstracts, Registration No. 10-0484399, Apr. 12, 2005, 1 p.
Korean Patent Abstracts, Registration No. 10-0486676, Apr. 22, 2005, 1 p.

* cited by examiner

*Primary Examiner*—Stephen Rosasco
(74) *Attorney, Agent, or Firm*—Innovation Counsel LLP

(57) ABSTRACT

A mask for sequential lateral solidification capable of preventing pattern deformation that may be caused by laser beam, and a method of manufacturing the same are provided. The mask includes a transparent substrate, and a heat-resistant oxide film pattern, disposed on the transparent substrate, blocking a laser beam.

6 Claims, 3 Drawing Sheets

MASK FOR SEQUENTIAL LATERAL SOLIDIFICATION AND METHOD OF MANUFACTURING THE SAME

REFERENCE TO RELATED APPLICATION

This application claims priority from Korean Patent Application No. 10-2005-0071414 filed on Aug. 4, 2005 in the Korean Intellectual Property Office, the disclosure of which is incorporated herein by reference in its entirety.

FIELD OF THE INVENTION

The present invention relates to a mask for sequential lateral solidification (SLS) and, more particularly, to a mask for SLS capable of preventing pattern deformation that may be caused by a laser beam.

BACKGROUND OF THE INVENTION

The manufacture of thin film transistor-liquid crystal displays (TFT-LCDs) has continued to attempt to replace amorphous silicon used as a TFT channel material with polysilicon to achieve higher performance, larger scale integration and faster response. However, leakage currents tend to occur at polysilicon grain boundaries and it becomes necessary to produce large-sized polysilicon grains to reduce grain boundaries. Conventional laser-based melting and crystallization can produce a mono-crystalline silicon film with a length of up to several micrometers, but cannot selectively produce mono-crystalline silicon grains at desired locations. To increase a grain size, a sequential lateral solidification (SLS) process has recently been suggested.

According to a suggested SLS process, a predetermined region of an amorphous silicon film is treated with a laser beam using a mask for crystallization and the mask is then moved at a pitch smaller than that of the crystal formed. Then, the amorphous silicon film is again treated with a laser beam using the formed crystal as a seed. In this way, the crystal size continuously grows. The silicon grains formed by the first shot of laser beam act as seeds, allowing lateral re-growth of mono-crystalline silicon in the amorphous silicon film. Theoretically, the SLS process can yield very long mono-crystalline silicon.

In a conventional SLS process for crystallization of amorphous silicon, a mask composed of a quartz plate and a chromium film pattern coated on the quartz plate is used. To crystallize amorphous silicon, a laser beam having high energy density is used. However, the crystallization of amorphous silicon using a laser beam with high energy density greatly reduces the durability of the mask.

SUMMARY OF THE INVENTION

The present invention provides a mask for sequential lateral solidification (SLS) capable of preventing pattern deformation caused by a laser beam. According to an aspect of the present invention, the mask for SLS includes a transparent substrate having a heat-resistant oxide film pattern for blocking the laser beam. The mask for sequential lateral solidification is produced by sequentially depositing a heat-resistant oxide film and a metal film on the transparent substrate, etching the metal film to produce a pattern in the metal film, using the metal film pattern as an etching mask to etch the heat-resistant oxide film and then removing the metal film pattern.

BRIEF DESCRIPTION OF THE DRAWING

The above and other features and advantages of the present invention will become more apparent by describing in detail exemplary embodiments thereof with reference to the attached drawings in which.

DETAILED DESCRIPTION

Figure 1:
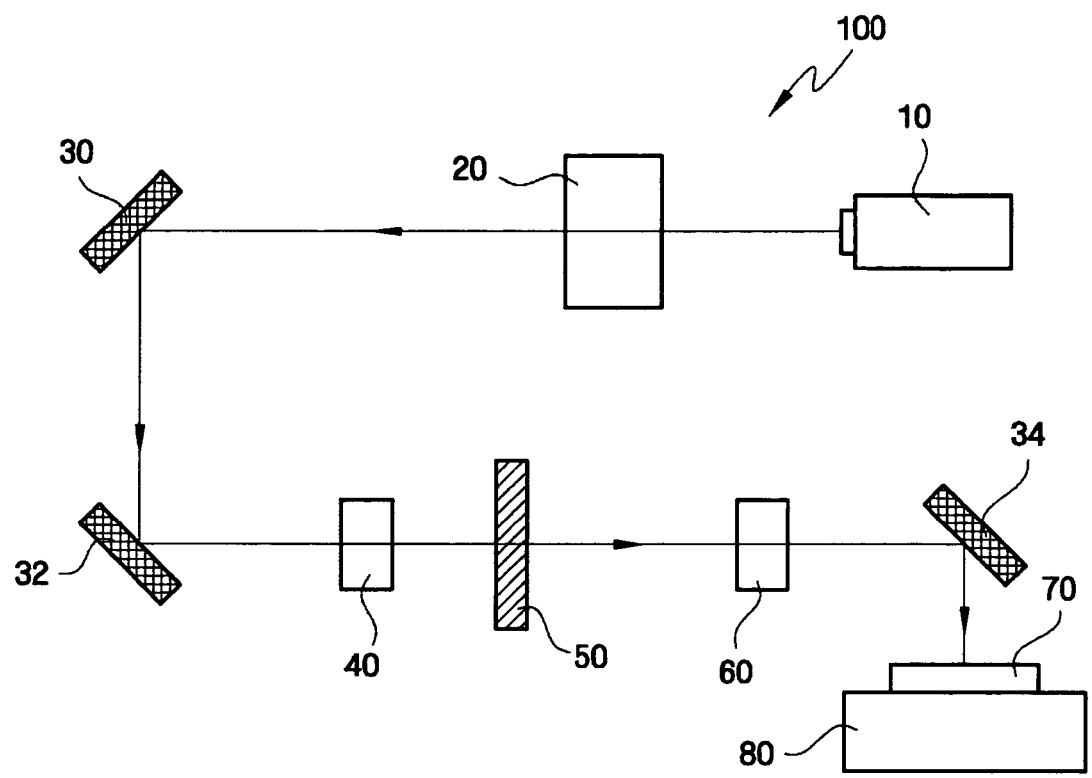
FIG. 1 is a view illustrating an apparatus for crystallization of amorphous silicon according to an embodiment of the present invention.

FIG. 1 is a view illustrating an apparatus 100 for crystallization of amorphous silicon according to an embodiment of the present invention.

Crystallization apparatus 100 is structured such that a light source 10, an attenuator 20, a focus lens 40, a mask 50, an imaging lens 60, and a translation stage 80 on which an amorphous silicon-coated substrate 70 is disposed are sequentially arranged. A plurality of reflectors 30, 32, and 34 are disposed between the attenuator 20 and the focus lens 40 and between the imaging lens 60 and the translation stage 80 to change the direction of incident light by reflecting the incident light at a predetermined angle.

Light source 10 is an XeCl or KrF excimer laser advantageously having a wave-length of 308 nm or 248 nm, respectively. A attenuator 20 adjusts the laser beam generated by the excimer laser to have a predetermined energy. Focus lens 40 and imaging lens 60 are responsible for focusing the laser beam. In particular, focus lens 40 equalizes long and short focal distances of the laser beams to ensure uniform laser beam energy. Mask 50 is patterned and thus forms the laser beam into a predetermined shape.

Accordingly, the laser beam generated by light source 10 is adjusted to have a predetermined energy by the attenuator 20, reflected by the reflectors 30 and 32, and focused by the focus lens 40. The laser beam partially passes through mask 50 and radiates onto substrate 70 via the imaging lens 60 and the reflector 34. Laser beam radiation is repeated while the translation stage 80 bearing substrate 70 is moved. To crystallize the other areas of amorphous silicon (not shown) coated on the substrate 70, laser beam irradiation is repeatedly performed while translation stage 80 or the mask 50 is moved a small distance (according to the desired pitch), so that silicon grains are grown.

Figure 2A:
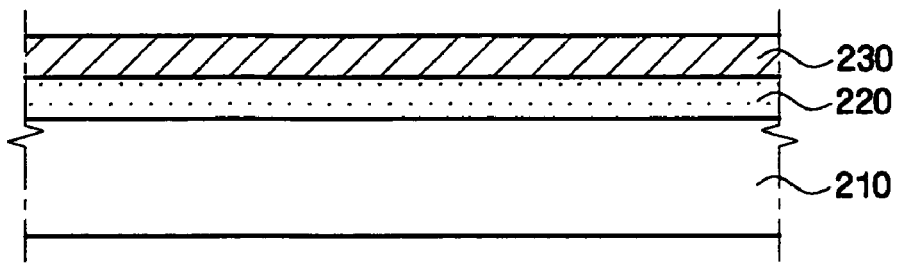
FIGS. 2A through 2D are cross-sectional views illustrating sequential processing steps for manufacturing a modified example of the mask shown in FIG. 1.

FIGS. 2A through 2D are cross-sectional views illustrating sequential processing steps for manufacturing a modified example of the mask of FIG. 1. Referring to FIG. 2A, a heat-resistant oxide film 220 and a metal film 230 are sequentially formed on a transparent substrate 210. The transparent substrate 210 may be made of a material allowing the passage of a laser beam. For example, the transparent substrate 210 may be made of quartz. Heat-resistant oxide film 220 is responsible for blocking the laser beam. When the heat-resistant oxide film 220 formed on the transparent substrate 210 is patterned in a subsequent processing step, the heat-resistant oxide film patterns remain on the transparent substrate 210 and form shielding areas for the laser beam. The portions of the transparent substrate 210 exposed by the pattern of removal of the heat-resistant oxide film 220 form transmitting areas for a laser beam.

The heat-resistant oxide film 220 may be a single-layered film or a multi-layered film made of, for example, $Al_2O_3$, ZrO, $SiO_2$, or MgO. Furthermore, the heat-resistant oxide film 220 may be made of a material having a melting point of about 2,000° C. or more so that it may not be melted during repeated shots of a laser beam. The heat-resistant oxide film 220 generally has a high transmittance to visible light. However, when the heat-resistant oxide film 220 is formed as a single-layered film or a multi-layered film with an appropriate thickness, it can block a laser beam. The heat-resistant oxide film 220 may be formed by one of various methods such as sputtering, chemical vapor deposition (CVD), and plating.

The metal film 230 formed on the heat-resistant oxide film 220 may be made of chromium (Cr) or the like. The metal film 230 may be formed by one of various methods such as sputtering, chemical vapor deposition (CVD), and plating. Sputtering is mainly used.

Figure 2B:
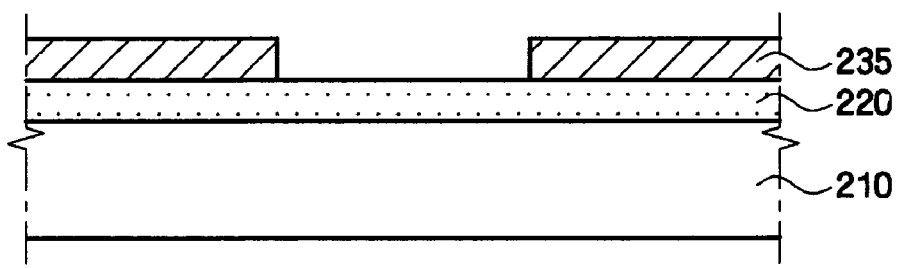

Next, referring to FIG. 2B, together with FIG. 2A, the metal film 230 is patterned in a predetermined shape to form a metal film pattern 235. The metal film 230 may be patterned using e-beam.

Figure 2C:
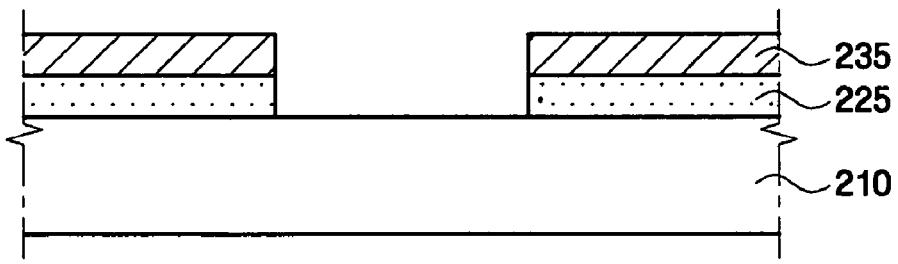

Next, referring to FIG. 2C, together with FIG. 2B, the heat-resistant oxide film 220 is patterned using the metal film pattern 235 as an etching mask to form a heat-resistant oxide film pattern 225. The heat-resistant oxide film 220 may be patterned by dry etching or wet etching. It is preferable to use anisotropic dry etching for accurate pattern formation. As described above, since the heat-resistant oxide film pattern 225 generally has a high transmittance to visible light, it is difficult to visually detect a defect of the heat-resistant oxide film pattern 225. However, considering that the metal film pattern 235 is formed in the same shape as the heat-resistant oxide film pattern 225, the defect of the heat-resistant oxide film pattern 225 can be detected by inspecting a defect of the metal film pattern 235.

Figure 2D:
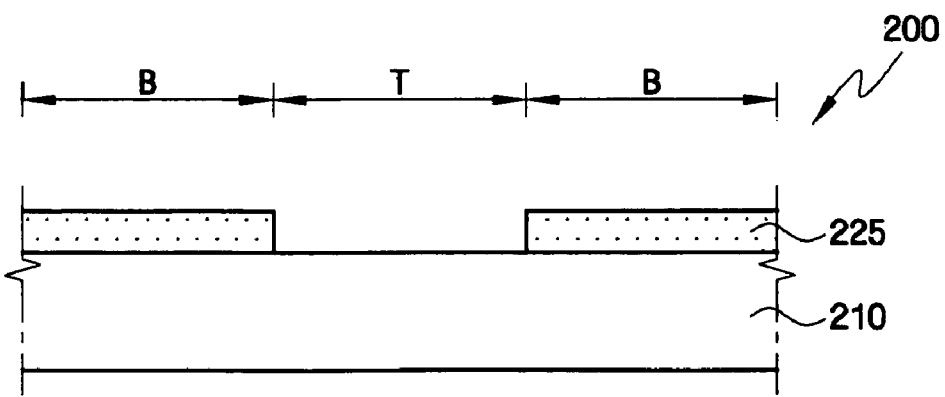

Next, referring to FIG. 2D, together with FIG. 2C, the metal film pattern 235 is removed to complete a mask 200 including a shielding area B and a transmission area T which are defined according to the presence or absence of the heat-resistant oxide film pattern 225. When amorphous silicon is crystallized using a laser beam with very high energy density, the laser beam is partially absorbed in the heat-resistant oxide film pattern 225. Since the heat-resistant oxide film pattern 225 is made of a material having a melting point of about 2,000° C or more, pattern deformation by the laser beam can be prevented, thereby improving the durability of the mask 200. Furthermore, since the defect detection of the heat-resistant oxide film pattern 225 can be performed using the metal film pattern 235, a desired pattern shape can be accurately achieved.

Figure 3:
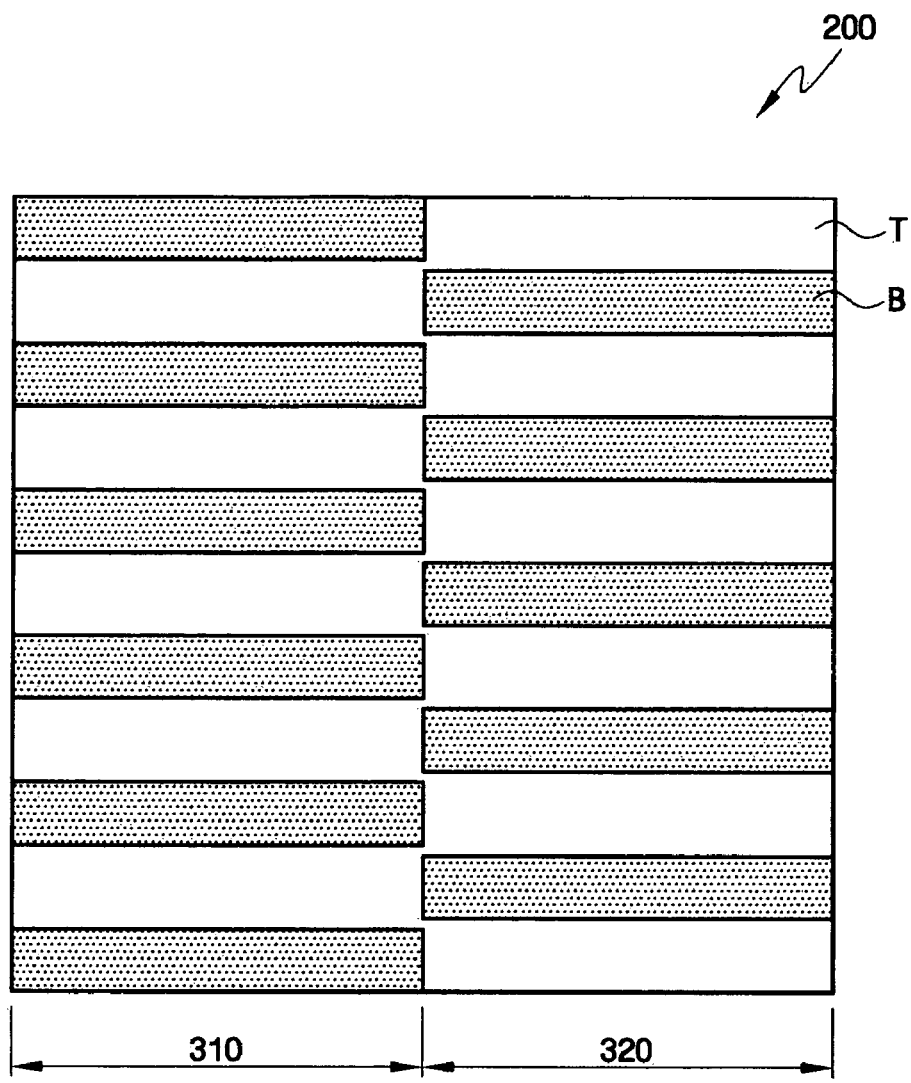
FIG. 3 is a plan view illustrating a mask for SLS according to an embodiment of the present invention.

FIG. 3 is a plan view illustrating a mask 200 according to an embodiment of the present invention. Referring to FIG. 3, the mask 200 includes a first stripe pattern 310 and a second stripe pattern 320 having reverse phase to the first stripe pattern 310. First and second stripe patterns 310 and 320 each include a transmission area T and a shielding area B which are alternately arranged, and extend horizontally. The first stripe pattern 310 is alternately arranged with respect to the second stripe pattern 320.

When the mask 200 is exposed to a laser beam, the laser beam can pass through the transmission area T, but cannot pass through the shielding area B since a heat-resistant oxide film pattern (see 225 of FIG. 2D) is formed in the shielding area B. In order to crystallize all areas of an amorphous silicon film using a laser beam, the width of the transmission area T may be greater than or equal to that of the shielding area B. The width of the shielding area B may be about 2 to 10 μm, but may vary according to the energy density of the laser beam, the state of the amorphous silicon film, etc.

The width of the transmission area T may be about twice or less the maximum growth length of silicon grains formed by a first shot of a laser beam. After the first shot, a melted portion of an amorphous silicon film is crystallized laterally from both sides of the melted portion to the middle portion to grow silicon grains. The silicon grains stop growing as soon as they collide with each other to form silicon grain boundaries. If the width of the transmission area T is greater than about twice the maximum growth length of silicon grains, fine silicon grains may be present in the vicinity of silicon grain boundaries.

The mask 200 of the embodiment of the present invention shown in FIG. 3 can be applied to a two-shot SLS process. According to the two-shot SLS process using the mask 200, first, a first shot of laser beam is applied to an amorphous silicon film formed on a substrate via the mask 200 to thereby crystallize an amorphous silicon area corresponding to the transmission area T of the mask 200. Then, the substrate is moved horizontally by about half a width of the mask 200, and a second shot of the laser beam is applied to the amorphous silicon film via the mask 200 to complete the crystallization of a desired area of the amorphous silicon film.

The above embodiment of the present invention has been illustrated in view of a mask with a stripe pattern, but the present invention is not limited thereto. That is, a mask according to the present invention can have various patterns such as a square pattern, a rhombohedral pattern, or a wedge-shaped pattern. Furthermore, a mask according to the present invention can also be applied to an n-shot (n≧3) SLS process, in addition to a two-shot SLS process.

Figure 4:
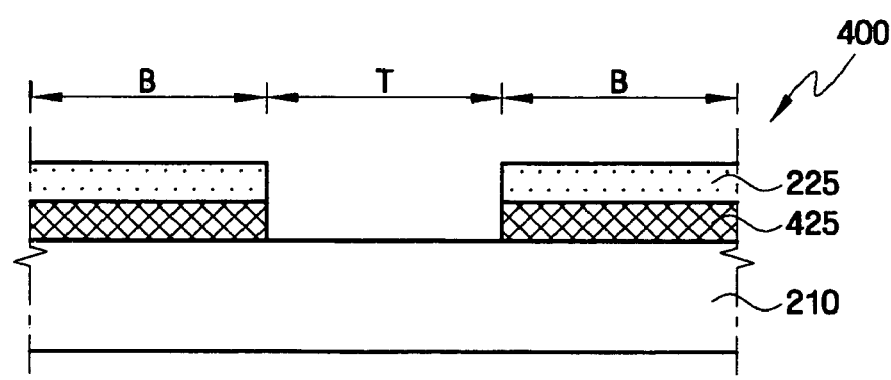
FIG. 4 is a sectional view illustrating a mask for SLS according to another embodiment of the present invention.

FIG. 4 is a sectional view illustrating a mask 400 for SLS according to another embodiment of the present invention. For convenience of illustration, components having the same functions as those shown in FIGS. 2A through 3 are represented by the same reference numerals, and thus, a detailed description thereof will be omitted. The mask 400 of the embodiment of the present invention shown in FIG. 4 has substantially the same structure as the mask 200 of the previous embodiment shown in FIG. 2D except those given below. That is, referring to FIG. 4, the mask 400 includes a transparent substrate 210, a heat-resistant oxide film pattern 225 formed on the transparent substrate 210, and a metal film pattern 425 for a photomask, interposed between the transparent substrate 210 and the heat-resistant oxide film pattern 225, having substantially the same pattern as the heat-resistant oxide film pattern 225.

Referring to FIG. 4, together with FIGS. 2B and 2C, when the heat-resistant oxide film 220 is patterned using the metal film pattern 235 as an etching mask, a metal film (not shown) for a photomask disposed below the heat-resistant oxide film 220 is patterned together with the heat-resistant oxide film 220 to form the metal film pattern 425 for the photomask. Here, when the metal film for the photomask is made of a dry-etchable material, the heat-resistant oxide film pattern 225 and the metal film pattern 425 for the photomask can be formed in substantially the same pattern by simultaneous dry-etching of the heat-resistant oxide film 220 and the metal film for the photomask. For example, the metal film pattern 425 for the photomask may be made of Mo, Ti, or its alloy.

As described above, pattern deformation can be prevented even when laser beam irradiation is repeatedly performed, and a pattern defect can be visually detected, thereby ensuring accurate formation of a desired pattern shape. While the present invention has been particularly shown and described with reference to exemplary embodiments thereof, it will be understood by those of ordinary skill in the art that various changes in form and details may be made therein without departing from the spirit and scope of the present invention as defined by the following claims. Therefore, it is to be understood that the above-described embodiments have been provided only in a descriptive sense and will not be construed as placing any limitation on the scope of the invention.

What is claimed is:

1. A mask for sequential lateral solidification consisting of:
a transparent substrate; and
a heat-resistant oxide film disposed on the transparent substrate, the heat-resistant oxide film including a pattern mask having a transmission area to expose a portion of the transparent substrate and transmit a laser beam therethrough, and a shielding area to block the laser beam, wherein the heat-resistant oxide film is formed as a single-layered film or multi-layered film made of $Al_2O_3$, $ZrO$, $SiO_2$, or $MgO$ wherein the heat-resistant oxide film pattern has a melting point of about 2,000 degree C. or more.

2. The mask of claim 1, wherein the heat-resistant oxide film pattern has a high transmittance to visible light.

3. The mask of claim 1, wherein the transparent substrate is made of quartz.

4. The mask of claim 1, wherein the laser beam is an excimer laser beam using 308 nm XeCl or 248 nm KrF.

5. The mask of claim 1, further comprising a metal film pattern for a photomask, interposed between the transparent substrate and the heat-resistant oxide film pattern, having substantially the same pattern as the heat-resistant oxide film pattern.

6. The mask of claim 5, wherein the metal film pattern for the photomask is made of Mo, Ti, or its alloy.

* * * * *